United States Patent
Smith et al.

(10) Patent No.: US 6,921,713 B2
(45) Date of Patent: Jul. 26, 2005

(54) SEMICONDUCTOR CHIP PACKAGE WITH INTERCONNECT STRUCTURE

(75) Inventors: John W. Smith, Horseshoe Bay, TX (US); Belgacem Haba, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/685,361

(22) Filed: Oct. 14, 2003

(65) Prior Publication Data

US 2004/0077129 A1 Apr. 22, 2004

Related U.S. Application Data

(62) Division of application No. 09/850,973, filed on May 8, 2001, now Pat. No. 6,664,621.
(60) Provisional application No. 60/203,190, filed on May 8, 2000.

(51) Int. Cl.$^7$ ............................................. H01L 21/44
(52) U.S. Cl. .................. 438/597; 438/598; 438/599; 438/612; 438/613; 438/614; 438/615; 438/617; 438/618; 438/687
(58) Field of Search .............................. 438/597–599, 438/612–615, 617–618, 687

(56) References Cited

U.S. PATENT DOCUMENTS

| | | | |
|---|---|---|---|
| 4,818,728 A | 4/1989 | Rai et al. | |
| 5,148,265 A | 9/1992 | Khandros et al. | |
| 5,148,266 A | 9/1992 | Khandros et al. | |
| 5,281,151 A | 1/1994 | Arima et al. | |
| 5,286,680 A | 2/1994 | Cain | |
| 5,455,390 A | 10/1995 | DiStefano et al. | |
| 5,518,964 A | 5/1996 | DiStefano et al. | |
| 5,640,049 A | 6/1997 | Rostoker et al. | |
| 5,688,716 A | 11/1997 | DiStefano et al. | |
| 5,706,174 A | 1/1998 | Distefano et al. | |
| 5,756,395 A | 5/1998 | Rostoker et al. | |
| 5,763,941 A | 6/1998 | Fjelstad | |
| 5,798,286 A | 8/1998 | Faraci et al. | |
| 5,802,699 A * | 9/1998 | Fjelstad et al. | 29/593 |
| 5,812,378 A * | 9/1998 | Fjelstad et al. | 361/769 |
| 5,976,913 A | 11/1999 | Distefano | |
| 5,989,936 A | 11/1999 | Smith et al. | |
| 6,002,168 A | 12/1999 | Bellaar et al. | |
| 6,218,215 B1 | 4/2001 | Distefano et al. | |
| 6,492,251 B1 | 12/2002 | Haba | |
| 6,573,609 B2 * | 6/2003 | Fjelstad et al. | 257/778 |
| 2001/0048591 A1 * | 12/2001 | Fjelstad et al. | 361/767 |

FOREIGN PATENT DOCUMENTS

| | | |
|---|---|---|
| WO | WO-96/02068 | 1/1996 |
| WO | WO-97/11486 | 3/1997 |
| WO | WO-97/11588 | 3/1997 |
| WO | WO-97/40958 | 11/1997 |
| WO | WO-98/44564 | 10/1998 |
| WO | WO-98/445564 | 10/1998 |

* cited by examiner

*Primary Examiner*—Lynne A. Gurley
(74) *Attorney, Agent, or Firm*—Lerner, David, Littenberg, Krumholz & Mentlik, LLP

(57) ABSTRACT

An active microelectronic element such as a semiconductor chip or wafer is bonded to an interconnect element having substantially the same coefficient of thermal expansion as the active element using small, rigid bonds, desirably made by a solid-phase bonding technique, which accommodate numerous closely-spaced interconnections. The assembly is provided with terminals movable with respect to the active element and interconnect element. The interconnect element desirably provides low-impedance conductive paths interconnecting active electronic devices within the active element.

25 Claims, 5 Drawing Sheets

SEMICONDUCTOR CHIP PACKAGE WITH INTERCONNECT STRUCTURE

CROSS REFERENCE TO RELATED APPLICATIONS

The present application is a divisional application of U.S. patent application Ser. No. 09/850,973, filed May 8, 2001, now U.S. Pat. No. 6,664,621, which application claims the benefit of U.S. Provisional Application Ser. No. 60/203,190 filed May 8, 2000, the disclosures of which are incorporated herein.

BACKGROUND OF THE INVENTION

The present invention relates to the art of semiconductor fabrication and packaging.

Semiconductor chips commonly incorporate a large number of active electronic devices such as transistors and diodes, passive devices such as resistors and capacitors, and larger devices made up of combinations of such active and passive devices as, for example, logic gates, memory cells, amplifiers and the like, all formed within a single, integral body. Most commonly, the body is formed from silicon, although other materials such as diamond and compound semiconductors can be used. The active devices in the chip typically are provided in one or more layers extending parallel to the front and back surfaces of the chip.

The various electronic devices of the chip typically are interconnected with one another by metallic conductors such as traces extending within the chip in the horizontal or "x" and "y" direction and metallic vias extending in the vertical or "z" direction. Typically, the traces and vias are formed of conductive material deposited during fabrication of the chip as, for example, aluminum or polysilicon. The traces and vias used to interconnect the electronic elements of the chip with one another complicate design and fabrication of the chip.

The traces which are fabricated during manufacture of the chip do not always provide optimum electrical characteristics. For example, traces formed from aluminum have a relatively high resistivity. Although processes for fabricating traces in a chip from low-resistivity metals such as copper are known, these processes impose special requirements in chip fabrication. Further, even if a low-resistivity metal is employed, the size and hence the cross-sectional area of traces which can be accommodated within a chip are subject to severe limitations. Traces extending within a chip often follow indirect routes because other elements of the chip lie in a direct route between the electronic elements connected by the traces.

Additionally, chips must be connected to external circuit elements. In the conventional approach to chip packaging, each chip is incorporated in a separate package bearing leads or other external connecting elements. Contacts on the surface of the chip are connected to these external connecting elements. The external connecting elements on the package are connected to a conventional circuit board or other circuit-bearing substrate. Alternatively, several chips may be mounted in a single package, commonly referred to as a "multichip module." These chips may be connected to one another and to a common set of external connecting elements, so that the entire assembly can be mounted to the substrate as a unit. In yet another alternative, the chip itself is attached directly to the substrate.

As described in Arima et al., U.S. Pat. No. 5,281,151, a rigid ceramic board may be provided with a set of "thin film" circuit layers overlying the ceramic board. The thin film layers include metallic traces on a material such as polyimide which has a relatively low dielectric constant. A chip is mounted to the thin film layers by solder balls in engagement with contacts on the chip. A signal can be routed from point to point within the chip along a signal path through a solder ball at one location on the chip, along a metallic trace of the thin film element and back into the chip through a solder ball at another location on the chip. The thin film layer assertedly provides low resistance and relatively rapid signal transmission between elements of the chip. In other embodiments, the interconnections can be formed within the ceramic circuit board itself, and the polyimide layers may be omitted.

Rostoker et al., U.S. Pat. Nos. 5,756,395 and 5,640,049 disclose generally similar interconnect structures associated with semiconductor chips. These devices rely on solder-bonding the interconnect structure to contacts on the active semiconductor chip itself. This in turn requires bulk melting of the solder during assembly, which in turn imposes significant constraints on the number and placement of the interconnects to provide sufficient space between interconnects and to avoid shorting between adjacent contacts.

Rai et al., U.S. Pat. No. 4,818,728 describes a process for making a composite semiconductor chip by use of projecting studs on one element received in pools of solder held in recesses on the surface of the opposing element, which suffers from similar drawbacks. The Rai et al. patent also mentions the use of a dielectric "bonding agent" on the surfaces of one semiconductor element to bond with the opposing element. Pace, U.S. Pat. No. 5,866,441 discloses the use of gold or similar ductile "protruberances" projecting from the surface of a chip which can be bonded to similar "protruberances" on a packaging module by processes such as thermocompression or ultrasonic bonding or by soldering. The resulting structure has a large gap between the chip and the module. To form a sealed structure, Pace uses a seal around the outside of the areas bearing the contacts. The horizontal dimensions of the chip and module must be increased to provide for this external seal, and the resulting structure contains a large air-filled gap.

As described in preferred embodiments of commonly assigned U.S. Pat. Nos. 5,148,265; 5,148,266; 5,455,390, 5,518,964, 5,688,716 and International Publication Nos. WO 96/02068 and WO 97/11486, the disclosures of which are all incorporated by reference herein, it is desirable to provide interconnections between the contacts on a chip and external circuitry by providing a further dielectric element, which may be referred to as a "interposer" or "chip carrier" having terminals. Terminals on the dielectric element may be connected to the contacts on the chip by flexible leads. The terminals on the dielectric element may be connected to the substrate as, for example, by solder bonding the terminals to contact pads of the substrate. The dielectric element and terminals remain movable with respect to the chip so as to compensate for thermal expansion and contraction of the components. That is, various parts of the chip can move with respect to the terminals as the chip grows and shrinks during changes in temperature. In a particularly preferred arrangement, a compliant dielectric layer is provided as a separate component so that the compliant layer lies between the chip and the terminals. The compliant layer may be formed from a soft material such as a gel, elastomer, foam or the like. The compliant layer mechanically decouples the dielectric element and terminals from the chip and facilitates movement of the terminals relative to the chip. The compliant layer may also facilitate movement of the terminals in the Z direction, towards the chip, which further facilitates testing and mounting of the assembly.

As disclosed in International Publication No. WO 97/40958, the disclosure of which is also incorporated by reference herein, the electrically conductive parts on the dielectric element may be connected to the chip by masses of a fusible, electrically conductive material which is adapted to melt at temperatures encountered during processing or operation of the assembly. These masses may be constrained by a surrounding compliant dielectric material so that they remain coherent while in a molten state. The molten masses provide another form of deformable conductive element, which allows movement of the flexible dielectric element relative to chip. As further disclosed in commonly assigned patents and patent applications, one or more chips may be mounted to a common dielectric element or interposer, and additional circuit elements also may be connected to such a dielectric element. The dielectric element may incorporate conductive traces which form interconnections between the various chips and electronic components of the assembly.

As described in certain preferred embodiments of commonly assigned International Publication No. WO 98/44564, the disclosure of which is hereby incorporated by reference herein, an interposer which is movable with respect to the chip may itself provide interconnections between devices within a single chip. This provides a uniquely desirable solution in that it facilitates mounting of the chip to an external substrate and also facilitates connections between devices within the chip. In particularly preferred embodiments of the structures taught in the '486 International Application, the conductive paths within the interposer include multiple conductors and are connected to the chip by leads which also incorporate multiple conductors to provide controlled-impedance connections entire signal paths. This facilitates high-speed signal transmission.

Despite these and other improvements, still further methods and structures for semiconductor chip packaging would be desirable.

SUMMARY OF THE INVENTION

One aspect of the invention provides microelectronic assemblies. A microelectronic assembly according to this aspect of the invention desirably includes an active microelectronic element as, for example, a semiconductor chip. The active microelectronic element has an active element body with surfaces including a front surface, one or more active electronic devices in the body and active element contacts exposed to the front surface. The assembly according to this aspect of the invention also includes an interconnect element having an interconnect element body formed separately from the active element body. Most preferably, the interconnect element body has a coefficient of thermal expansion substantially matched to the coefficient of thermal expansion of the active element body. The interconnect element desirably has a first surface confronting the front surface of the active element body. The interconnect element most preferably has interconnect conductors carried by the interconnect element body, at least some of the interconnect conductors being connected to at least some of the active element contacts.

The assembly further includes terminals for connection to an external substrate. At least some of the terminals overlies one or more of the surfaces of the interconnect element body, the active element body, or both. For example, the terminals may overlie a second surface of the interconnect element body facing away from the active element body. In another example, the terminals overlie a rear surface of the active element body. The terminals are connected to at least some of the interconnect conductors and are movable with respect to the interconnect element body and the active element body.

The interconnect element body and the active element body can be rigidly connected to one another. This arrangement facilitates the use of small connections to the active microelectronic element, at small center-to-center distances or contact pitch. The interconnect element can provide routing between terminals of the same active microelectronic element as, for example, routing of signals which otherwise would be carried by internal conductors of the chip, as well as connections between the active microelectronic element and the terminals. The movable terminals provide compensation for thermal expansion and contraction when the assembly is mounted to a circuit panel or other substrate.

Another aspect of the invention provides methods of making microelectronic assemblies. A method in accordance with this aspect of the invention desirably includes providing an active microelectronic element including active devices in an active element body and separately providing an interconnect element including an interconnect element body and interconnect conductors having electrical conductivity at least equal to that of copper in an interconnect body. The method further includes joining the interconnect element to the active element so as to connect the interconnect conductors to active devices in the active element. Most preferably, the method includes the further step of connecting terminals to at least some of the interconnect conductors so that the terminals are movable with respect to the interconnect body and so that the terminals are exposed for connection to an external substrate.

Because the interconnect conductors are provided in a separate interconnect body, formation of the interconnect conductors does not influence or impede the processes used to make the active microelectronic element. For example, the difficulties associated with forming copper conductors within the body of a semiconductor wafer do not arise. Yet, the finished assembly can provide benefits such as low-impedance interconnections among active devices within the active element.

Yet another aspect of the invention provides methods of joining microelectronic elements to one another. Methods according to this aspect of the invention desirably include the step of juxtaposing first and second microelectronic elements. The first microelectronic element has a first body with a body surface and with metallic contact bumps projecting from this surface. The second microelectronic element has a second body which has a body surface, recesses in such surface and metallic contact pads disposed in the recesses. The elements are juxtaposed with one another so that the body surfaces confront one another and so that the bumps project into the recesses.

The method further includes bonding the bumps to the contact pads by a substantially solid phase bonding process while urging the bodies toward one another so that at least some of said bumps, at least some of said contacts or both deform within said recesses. Optionally, the method includes bonding the body surfaces to one another, most preferably simultaneously with the step of bonding the bumps to the pads.

Preferred methods in accordance with this aspect of the invention can be used to bond small contacts and pads which are disposed at a small contact pitch. These methods can be used, for example, to connect the active microelectronic element to the interconnect element in the methods and assemblies discussed above, and for other purposes. The methods can provide reliable connections despite minor deviations from perfect planarity and dimensions in the elements, bumps and contact pads.

These and other objects, features and advantages of the invention will be more readily apparent from the detailed description of the preferred embodiments set forth below, taken in conjunction with the accompanying drawings.

DETAILED DESCRIPTION OF THE PREFERRED EMBODIMENTS

Figure 1:
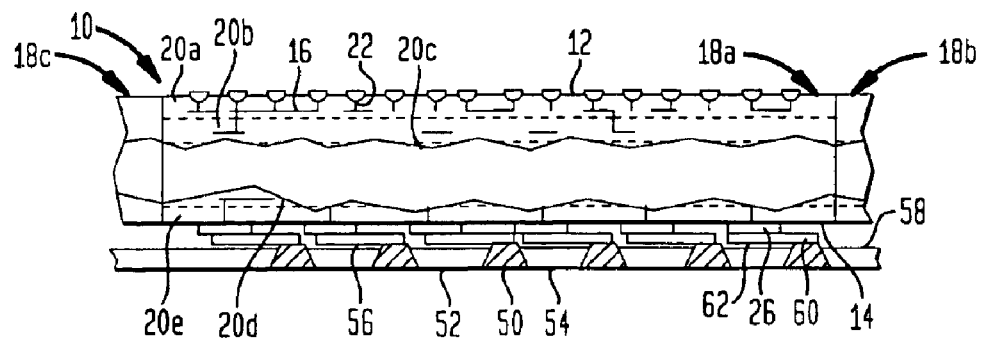
FIG. 1 is a diagrammatic, partially-sectional view of components during one stage of a process according to one embodiment of the invention.

A chip packaging method in accordance with one embodiment of the invention employs an interconnect element 10 having a top or first surface 12 and a bottom or second, oppositely facing surface 14. Interconnect conductors extend in horizontal direction generally parallel to the surfaces 12 and 14 and in vertical directions. Body 10 desirably has substantially the same horizontal dimensions as a conventional semiconductor wafer used in fabrication of the chips to be mounted on the body. The body incorporates numerous regions 18, each of which includes a set of interconnect conductors 16 to be associated with a single semiconductor chip. One such region 18A is seen in FIG. 1, along with fragments of neighboring regions 18B and 18C. Although these regions are delineated by lines in FIG. 1 for clarity of illustration, there need not be any discrete visible boundary between regions in the actual body. Also, it should be appreciated that a wafer-sized body may include hundreds or even thousands of such regions.

Body 10 desirably is fabricated as a set of individual layers 20, such layers bearing interconnect conductors 16. A few layers 20A–20C are shown near the top of the body 10 and two layers 20D and 20E are illustrated near the bottom of the body in the partially cut-away illustration of FIG. 1. In practice, the body may include any number of layers. Desirably, the body is fabricated by making the various layers in parallel to incorporate the dielectric material and the conductors and then joining the layers to one another to form a unitary body. This permits inspection and testing of the individual layers so that the body as a whole can be fabricated without discarding numerous layers if defects are found in one layer. The individual layers can be made by fine-line lithography processes similar to those used in fabrication of semiconductor wafers. Because the interconnect conductors can be considerably larger than the conductive elements commonly found in semiconductor wafers, the process can be performed readily, using relatively inexpensive equipment.

The dielectric material of body 10 is selected so that the body as a whole, with the conductors therein, has a coefficient of thermal expansion close to that of the chips which will be mounted on the body. Thus, the coefficient of thermal expansion of the body desirably is within about $6 \times 10^{-6}$ cm/cm-° C. of the coefficient of thermal expansion of the chips to be mounted on the body and more preferably the coefficient of thermal expansion of the body is matched to the coefficient of thermal expansion of the semiconductor devices to within about $3 \times 10^{-6}$ cm/cm-° C. Even closer matching is still more preferred. For use with conventional silicon-based microelectronic elements, the dielectric material of the body desirably is a material selected from the group consisting of silicon, alumina, glass and ceramics.

Conductors 16 desirably are formed from one or more metals having conductivity equal or greater than that of copper as, for example, copper, silver and gold. Conductors 16, and particularly the horizontal traces, included in the conductors, desirably are about 5 $\mu$m thick or more and desirably have widths about 10 $\mu$m or more, most typically about 15–40 $\mu$m. Thus, the horizontal traces desirably have greater cross-sectional area than the horizontal internal conductors commonly used within chips themselves. The conductors may be positioned within the interiors of individual layers 20, on surfaces of the layers or both. Most typically, the conductors are disposed on one or both surfaces of individual layers. Conductors extending to or on surfaces of individual layers may be joined with conductors on or in the adjacent layers during the lamination process to provide continuous conductive pads extending through two or more of the individual layers.

Conventional techniques used in layout of multi-layered circuitry can be employed in routing the conductors. For example, the conductors typically are arranged so that the conductors in one layer extend predominately in the "x" horizontal direction whereas the conductors of the next layer extend predominantly in the orthogonal-"y" horizontal direction. Although only a few conductors are illustrated in FIG. 1, in actual practice the interconnect element may incorporate hundreds or even thousands of conductors. Other conductive elements (not shown) such as conductive potential planes for carrying ground or power potential may be provided between layers of conductors. These potential planes are electrically isolated from most of the conductors, but may be connected to those conductors which serve as ground or power conductors in the assembly. Typically, the potential planes have holes formed therein so that the vertically extending conductors can pass through the ground or power planes at the holes without contacting the potential plane. The conductors extending in planes adjacent to the potential planes are separated from the potential planes by intervening dielectric materials so that the conductors and adjacent potential plane or planes form striplines.

Some of the conductors 16 include first or top contact pads 22 (FIGS. 1 and 2) disposed adjacent the top surface 12 of body 10 but slightly recessed below such surface. For example, the tops of these contact pads may be disposed about 15 $\mu$m to about 30 $\mu$m below surface 12. These pads may be formed from the same materials as the remainder of the conductors and may include one or more metals that facilitate the bonding process discussed below. For example, where the bonding process is a diffusion or eutectic bonding process which involves formation of an alloy, contact pads 22 may optionally incorporate a metal adapted for formation of the alloy as, for example, a thin layer of tin, germanium or other metal adapted to form a low-melting alloy with gold.

Figure 3:
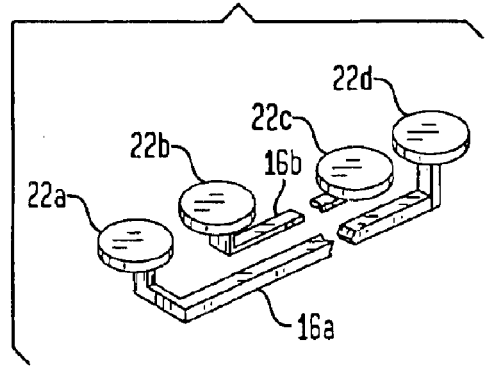
FIG. 3 is a diagrammatic perspective view of parts of one component in FIG. 1.

Some or all of conductors 16 may be provided in sets of conductors extending parallel to one another and mutually adjacent to one another such as conductors 16A and 16B schematically depicted in FIG. 3. The conductors of each such set can have a set of mutually adjacent contact pads such as pads 22A and 22B at one end and can have another set of mutually adjacent contact pads such as contact pads 22C and 22D at the opposite end. Although conductors 16A and 16B are depicted as simple, straight conductors, such mutually adjacent sets of conductors may include jogs or bends and/or vertical transitions between layers of conductors. Desirably, the conductors of each said set remain adjacent to one another to all such jogs and bends. As described in greater detail in commonly assigned International Publication Nos. WO 97/11588 and WO 98/44564, the disclosures of which are hereby incorporated by reference herein, such a set of mutually adjacent conductors can be connected to adjacent contact pads of a chip to provide a controlled-impedance, interference-resistance signal path. Thus, one conductor of each set may serve as a first signal conductor whereas another conductor of the same set may serve as a signal path to carry a signal of the opposite polarity or to carry a reference potential such as ground. Typically, the adjacent contact pads at each end are connected to the same device within the chip, such as to opposite-polarity inputs or outputs of an amplifier, transmitter or receiver.

Figure 2:
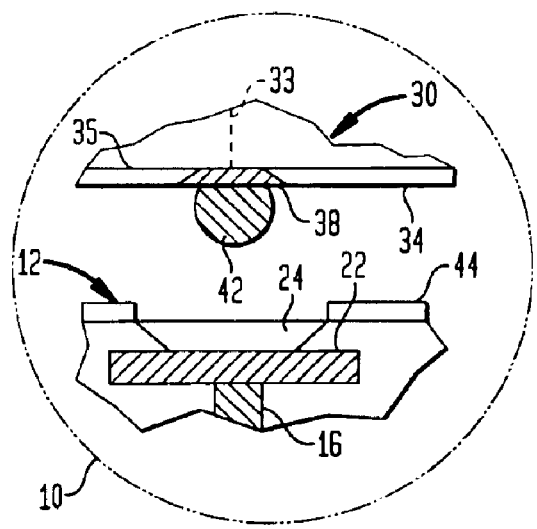
FIG. 2 is a fragmentary sectional view on an enlarged scale of portions of the components of FIG. 1 during a stage of the process.

As best seen in FIG. 2, a recess 24 is formed in the top surface 12 of body 10 over each contact pad 22. Recesses 24 may be formed by selectively removing the dielectric material over contact pads 22 as by laser, ablation, chemical etching, dry etching or other suitable etching methods. Desirably, the top or first surface 12 of the interconnect element body is lapped to provide a flat surface before etching to form the recesses. The recess extends downwardly from the top surface to the contact pad so that the pad is accessible from the top surface. The locations of top contact pads 22 are selected to match the locations of the contact pads on the active semiconductor device to be assembled to body 10. The contact pads 22 and recesses 24 desirably are slightly larger than the contact pads on the active device. However, the contact pads and recesses can be small so that they can be disposed at small center-to-center distances to match small spacing between adjacent contact pads on the active semiconductor element. For example, a center-to-center distance or pad pitch of 100 $\mu$m or less and more desirably about 40–60 $\mu$m, and most preferably about 50 $\mu$m can be used. Still smaller contact pitch, less than 40 $\mu$m may be used.

Interconnect element 10 also includes second or bottom contact pads 26 exposed at the second or bottom surface 14. The particular second contact pads 26 illustrated in the drawing project from the bottom surface. However, these contact pads may be flush with or recessed in the bottom surface provided that the bottom contact pads are accessible at the bottom surface for connection as discussed below. The second or bottom-surface contact pad 26 typically are larger than the first or top surface contact pads 22. Also, the second or bottom-surface contact pads 26 may be disposed at a greater center-to-center distance or pitch than the first or top contact pads 22. Thus, the second contact pads 26 typically are disposed at a pad pitch of about 100 to about 1000 $\mu$m, although smaller or larger pitches may be employed. The bottom-surface or second contact pads 26 are connected to some of conductors 16 in the body. The second or bottom surface contact pads 26 may be formed from metals similar to those employed for the top surface contact pads or from other conductive materials.

Figure 4:
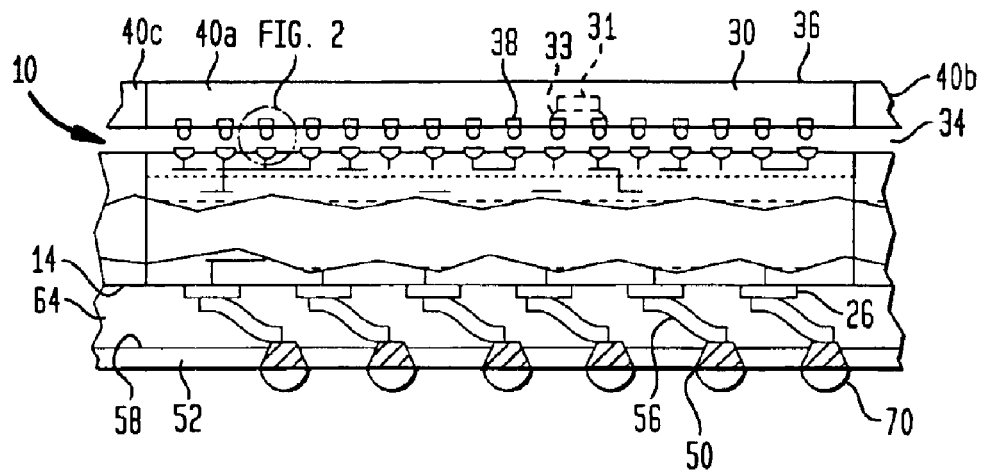
FIG. 4 is a view similar to FIG. 1 but depicting the components at a later stage of the process.
Figure 5:
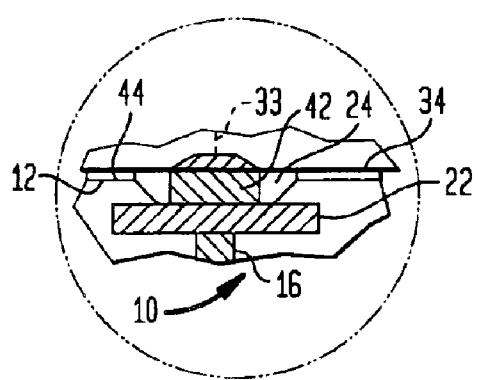
FIG. 5 is a view similar to FIG. 2 but depicting the components at a later stage of the process.

In a bonding process according to one embodiment of the invention, interconnect element 10 is juxtaposed with an active microelectronic element such as semiconductor wafer incorporating a large number of electronic devices schematically indicated at 31 in FIG. 4. Wafer 30 has a front surface 34 and a rear surface 36. The wafer also includes numerous active element contacts 38 exposed at the front surface 34 of the wafer. The particular active element contacts 38 illustrated in FIGS. 2, 4 and 5 are flush with the front surface of wafer 30, but the contacts 38 may project from the front surface; may be flush with the front surface or may be recessed relative to the front surface, provided that the contacts are exposed and accessible from the front surface. Contacts 38 are connected to electrical devices 31 by internal conductive paths 33 within the wafer. Wafer 30 includes a large number of individual regions which will form individual semiconductor chips such as region 40A and regions 40B and 40C, partially illustrated in the fragmentary view of FIG. 4. Although the boundaries between the regions or chips 40 are illustrated by lines in FIG. 4, there need not be a visible separation between adjacent chips in the actual wafer. Typically, the boundaries between adjacent chips are referred to as "saw lanes". These portions of the wafer are intended to be destroyed during separation of the chips from one another in conventional processing. Thus, these portions of the wafer do not incorporate devices which are required during normal operation of the chip. They may include special devices which are used only during test operations prior to separation of the chips from one another. Alternatively, the saw lanes may be composed entirely of inert material. Also, the wafer typically is not of uniform composition. Typically, the wafer is formed principally from one or more semiconductor materials such as silicon, compound semiconductors such as II–VI compounds or III–V compounds such as GaAs, or diamond, but includes internal metallic elements such as aluminum traces constituting conductive paths 33 within the wafer. Also, the wafer typically includes a thin passivation layer 35 (FIG. 2) at its front surface. The passivation layer may be formed from an inorganic dielectric such as a silicon oxide or an organic material such as polyimide.

Contacts 38 carry bumps 42 formed in whole or in part from a structural metal, desirably a relatively soft metal such as gold or other malleable metal. The bumps need not be of uniform composition. For example, each bump may include a main portion formed from a structural metal with a layer of another metal adapted to facilitate bonding. These bumps may be applied using conventional operations commonly referred to as wafer-bumping. The bumps project from the front surface of the wafer. Desirably, the height of the extent of each bump above the surface of the wafer is slightly greater than the nominal depth of recesses 24. Also, bumps 42 desirably have an aspect ratio or ratio of horizontal dimension h to vertical projection v above the wafer surface which is between about 0.5:1 and 2:1, desirably about 0.8:1 to 1.2:1, and most desirably about 1:1.

A layer 44 of a low-melting glass frit, high-temperature epoxy or other heat-activatable dielectric surface bonding material, desirably having a coefficient of thermal expansion close to those of the wafer and interconnect element body, is provided on the top or first surface 12 of the interconnect element body; on the front surface 34 of the wafer or both.

The wafer or active microelectronic element 30 is aligned with the interconnect body 10 so that each bump 42 and contact 38 is aligned with the appropriate recessed 24 and contact pad 22 on the interconnect body. Because the pads 22 and recesses 24 are slightly greater in diameter than the pads 38 and bumps 42, the alignment need not achieve exact concentricity between the pads 38 on the active microelectronic element and the pads 22 on the interconnect element. The alignment process may employ conventional machine-vision systems and may use fiducial markers (not shown) on the wafer and on the interconnect element with or without such a machine-vision system.

In the next stage of the process, the active microelectronic element or wafer 30 is moved toward interconnect element 10 so that the front surface 34 of the wafer approaches the first or top surface 12 of the interconnect element. Bumps 42 on the wafer enter into recesses 24 on the interconnect element body and the bumps 42 engage the top surface or first contact pads 22. Before or during the engagement process, the active electronic element and interconnect element are brought to an elevated temperature, desirably about 300–450° C. The active microelectronic element 30 and interconnect element 10 are forced towards one another so that the bumps 42 deform and intimately engage the contact pads 22 as shown in FIG. 5. Recesses 24 provide room for deformation of the bumps 42. Thus, the front surface 34 of the active microelectronic element 30 closely approaches the first or top surface 12 of interconnect element 10. During this process, irregularities or tolerances in the vertical placement of contacts 38 and pads 22, such as those caused by warpage or other non-planarity of the body surfaces will be taken up by differences in deformation of bumps 42. That is, if a particular pad 38 and mating pad 22 are relatively close to one another at the start of the engagement process, the associated bump 42 will be deformed to a relatively large degree, but if a pad 38 and mating pad 22 are relatively far from one another at the start of the engagement process, the associated bump 42 will be deformed to only a small degree. However, in both cases, the bump will be deformed to at least some degree and will intimately engage the contact 22 on the interconnect element.

As the bumps deform into engagement with contact pads 22, metallurgical bonds are formed between the bumps and the contact pads. That is, the metal of the bumps merges with the metal of the contact pads to form a unitary metal body. Additional bonding may also occur between the bumps 42 and the contacts 38 of the active microelectronic element initially carrying the bumps. The metallurgical bonding may occur, for example, by simple application of heat and pressure without formation of a liquid phase as, for example, where a gold bump 42 engages a gold or gold-plated contact pad 22. Alternately, the metallurgical bonding process may involve temporary formation of an interfacial liquid layer. However, the metallurgical bonding desirably does not involve bulk melting of the bump or the contact pads. For example, in a eutectic bonding process, a metal such as tin on contact pad 22 or on bump 42 forms a low-melting alloy with gold on bump 42 or on contact pad 22 so that a small liquid phase is present at the interface between the bump and the contact pad.

This liquid phase can solidify by diffusion of the tin or germanium into the neighboring gold of the pad which raises the liquidus temperature of the eutectic so that the eutectic freezes even while the assembly is maintained at elevated temperature. Alternatively, the liquid phase can solidify upon cooling of the assembly. As used in this disclosure, the term "substantially solid-phase bonding process" means a bonding process which operates without bulk melting but which may involve formation of an interfacial liquid phase as discussed above. Because there is no bulk melting, problems of confining a molten or liquid phase and avoiding short-circuiting caused by flow of such a bulk phase do not arise. The bumps may include a thin coating of a solder such as a silver-tin-copper solder or a lead alloy solder over a higher-melting core, so that only a small amount of solder, and less than the entire volume of the bump, melts. For example, a relatively low-melting solder may be provided over a core of a higher-melting solder which acts as a structural metal and which does not undergo bulk melting in the process. In other embodiments, where bulk melting can be accepted, the bumps may consist entirely of a solder having uniform composition.

As the surfaces of the interconnect element and active element approach one another, the front surface 34 of the active element abuts the frit or bonding material layer 44 on the top surface 12 of the interconnect element. Under the influence of the heat and pressure applied in the process, the bonding material forms a solid, desirably gas-tight bond with the front surface of the active element. Active microelectronic element 30 and interconnect element 10 effectively merge to form a unitary composite wafer.

In a further stage of the process, terminals 50 are electrically connected to the second surface or bottom contact pads 26 of the interconnect element so that the terminals 50 are movable with respect to the interconnect element. As illustrated in FIGS. 1 and 4, a dielectric interposer such as flexible sheet of a polymeric material such as polyimide is provided with terminal structures 50 exposed at a bottom surface 54 of the sheet. A set of flexible leads 56 overlies the top surface 58 of the sheet. Each lead 56 has a terminal end 60 permanently fastened to the sheet and electrically connected to one or more of the terminals 50 and has a tip end 62 remote from the terminal end. Desirably, the tip ends 62 are releasably connected to the top surface 58 of the sheet. The sheet is juxtaposed with the bottom surface 14 of the interconnect element and the tip ends 60 of the leads are bonded to the second bottom surface contact pads 26 of the interconnect element using electrically conductive bonding material (not shown) carried on the tip ends of the leads or on contact pads 26.

After bonding, the interconnect element and sheet are moved away from one another so as to deform leads 56 through a pre-selected vertical displacement. The sheet may optionally move in horizontal directions as well to facilitate bending of leads 56 to the vertical extensive disposition. During or after movement of the sheet, a flowable material such as a liquid gel or elastomer precursor may be introduced between the top surface 58 of sheet 52 and the second or bottom surface 14 of interconnect element 10. The flowable material desirably forms a compliant dielectric layer 64 such as a gel or elastomer. For example, the flowable material may be cured to form the dielectric layer. These stages of the process may be performed by the methods described in commonly assigned U.S. Pat. No. 5,518,964, incorporated by reference herein. Additional variations and refinements of such processes, and related processes, are described, for example in commonly assigned U.S. Pat. Nos. 5,706,174, 5,798,286, and 5,763,941, 5,976, 913 and 5,989,936, the disclosures of which are all incorporated by reference herein. Leads 56 may be carried on interconnect element 10 rather than on sheet 52 prior to engagement of the sheet and the interconnect element. Also, the leads may initially be curved so as to facilitate defamation during movement of the sheet relative to the interconnect element. Other processes for connecting terminals to a microelectronic element so that the terminals are movable with respect to such element, such as those as taught in the other patents and publications incorporated by reference herein, may be used instead of the process taught in the '964 patent and related processes.

Connection of the terminals 50, deformation of the leads, formation of the compliant layer 64 or both may be performed before, during or after bonding the active microelectronic element 30 to the interconnect element. If the terminal connecting step is performed prior to assembly of the interconnect element and active microelectronic element, the resulting sub-assembly may be tested before assembling the active microelectronic element. Also, the processes used in attaching the leads and terminals cannot affect the active microelectronic element. If the active microelectronic element is bonded to the interconnect element 10 before assembling leads 56 and terminals 50 to the interconnect element, the interconnect element serves as a physical barrier which protects the active microelectronic element from the materials and processes used to bond the leads to the interconnect element.

The attachment of the terminals and leads can be performed readily because the bottom pads 26 are relatively few in number and disposed at contact pitch substantially greater than the contact pitch of the active microelectronic element itself. That is, the process used to attach the leads and terminals need not accommodate the very fine contact pitch of the active microelectronic element itself. The bottom or second surface contact pads 26 can be relatively few because these elements need only accommodate the external connections between the chip and external circuitry. By contrast, the top surface contact pads 22 carry both external connections of the active microelectronic element and internal interconnections between devices in the active microelectronic element. Thus, applying the movable terminals to the bottom surface contact pads presents a simpler task than applying movable terminals to the contacts 38 of the chip itself. A large number of interconnections can be accommodated by the top surface contact pads so that more of the internal connections within the active microelectronic element can be brought into the interconnect element.

After application of the terminals 50 and formation of compliant layer 64, the resulting assembly is severed by cutting along saw lanes or lines between adjacent regions 40 of the active element and adjacent regions 18 of the interconnect element. The dielectric sheet 52 is severed in this process as well. This forms individual units, each including a single chip 40, a single region 18 of the interconnect element and a corresponding region of sheet 52 with corresponding terminals. The chip 40 and interconnect element region 18 act as a unitary, composite chip. The individual units can be mounted to external substrates such as circuit boards using conventional surface-mounting techniques. For example, terminals 50 can be provided with masses of solder or other bonding material, and these masses can be used to bond the terminals 50 to contact pads on the external substrate. In other cases, the terminals 50 are not provided with solder masses. For example, the terminals may be configured as a land grid array. Terminals 50 may also be configured for engagement with a socket. The movable terminals 50 provide compensation for relative movement of the substrate and the composite chips due to differential thermal expansion during surface mounting and/or during service. In effect, the movable terminals mechanically decouple the composite chip from the circuit board so that these parts are not subject to appreciable mechanical stresses caused by thermal effects.

Figure 6:
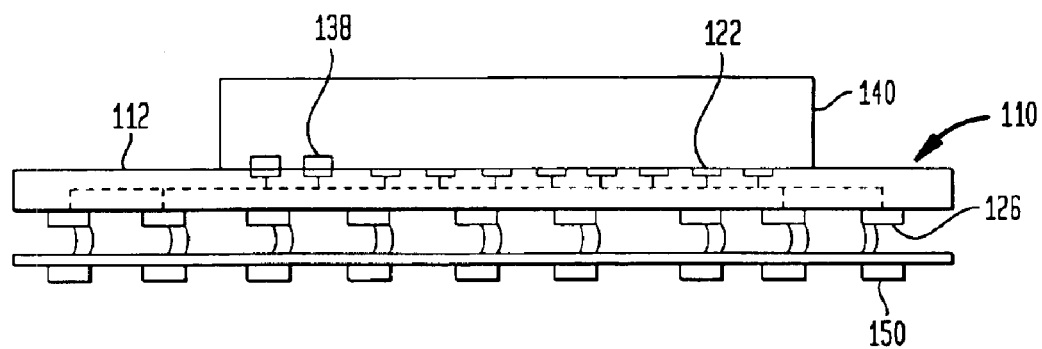
FIG. 6 is a diagrammatic elevational view of an assembly according to a further embodiment of the invention.

Numerous variations and combinations of the features discussed above can be utilized without departing from the present invention. For example, as shown in FIG. 6, the interconnect element 110 may have horizontal dimensions larger than the horizontal dimensions of a chip 140 and hence the bottom or second surface contacts 126 of the interconnect element may be disposed over a larger area than the top surface contact's 122 and the mating contacts 138 of the chip. In this arrangement, the bottom surface contact pads 126 of the interconnect element and the terminals 150 may be disposed over an area substantially larger than the chip itself. Typically, these assemblies are made by separating individual chips from the wafer before joining to the interconnect element. The interconnect element may be in the form of a wafer size or other large element and numerous separate chips may be bonded to such a large element simultaneously as, for example, by positioning all of the chips and then forcing the chips downwardly onto the interconnecting element under heat and pressure. To assure accurate alignment, the individual chips may be temporarily bonded to the top surface 112 by "tacking" the chips in place using an adhesive or other material, which is degraded or dissipated during the bonding process. The individual chips may be aligned with the interconnect element using a conventional machine-vision system or other robotic system.

Contacts of chips or wafers can be electrically connected to the contact pads of an interconnect element using the processes taught in copending, commonly assigned U.S. Provisional Patent Application Ser. Nos. 60/148,612 filed Aug. 12, 1999 and 60/148,233 filed Aug. 11, 1999; and U.S. patent application Ser. Nos. 09/523,512; 09/523,513 and 09/523,514, the disclosures of which are hereby incorporated by reference herein. As more fully described in certain preferred embodiments of those applications, bonding may be performed within a working space at least partially bounded by a flexible barrier. For example, the working space may be defined at least in part by one or both of the elements to be connected, such as the active microelectronic element and the interconnect element, and the flexible barrier may be a polymeric or other film extending between these elements. The working space may be brought to a low partial pressure of oxygen to limit the effect of oxides on the bonding process. The elements may be biased against one another by a fluid pressure outside of the working space exceeding the total absolute pressure within the working space. For example, where the total absolute pressure within the working space is below atmospheric pressure, atmospheric pressure will bias the elements toward one another. As taught in certain embodiments of the same applications, bonding materials can be activated by radiant energy directed through one or both of the elements to be connected, and the heating process may be a momentary heating process, such as by brief application of such radiant energy. As further disclosed in certain embodiments of these applications, elements to be connected to one another can be positioned and temporarily held in position relative to one another by a temporary bonding material, such as an adhesive which can be degraded by the bonding process itself. The components can be aligned with one another at room temperature, rather than at the elevated temperatures typically used to achieve electrical connection and form permanent bonds. As also taught in certain embodiments of those applications, small masses of bonding material can be applied on conductive features such as the contacts of a wafer by exposing the wafer to the bonding material in liquid form, so that the bonding material adheres to the conductive features but does not adhere to the surrounding surface as, for example, to the passivation layer of a wafer.

In a further variant, the contacts of an active microelectronic element can be electrically connected to the contact pads of an interconnect element using a conductive adhesive in place of the electrically conductive bonding material 42 discussed above with reference to FIG. 2. Such an adhesive may be applied selectively so that the adhesive is present only on the contacts 38 of the active microelectronic element and/or on the contact pads 22 of the interconnect element. In a further variant, the conductive bonding material 42 and surface bonding material 44 may be replaced by a thin film of an anisotropic conductive material covering both the contact pads and the regions of the interconnect element first or top surface 12 between the contact pads. Such a film of anisotropic conductive material provides substantial electrical conductivity in the direction through the film, but does not provide substantial conductivity in the directions parallel to the surface of the film. The anisotropic conductive material may be carried on the active microelectronic element, rather than on the interconnect element.

In yet another variant, the surface bonding material 44 which serves to secure the body of the chip to the interconnect element body (FIGS. 2 and 5) is provided only adjacent the periphery of each chip. For example, where the active microelectronic element is a wafer such illustrate in FIGS. 1 and 4, the surface bonding material may be provided only adjacent the saw lanes or lines between chips. Thus, the surfaces of the chip and interconnect element are bonded to one another only in a surface bonding region surrounding the contacts and contact pads. However, the surface bonding material still forms a hermetic seal around the area occupied by the bumps and contact pads. If the surface bonding material is remote from the contacts and contact pads, the surface bonding material need not be dielectric, and hence a metal may be used as a surface bonding material. The surface bonding material may be activated by phenomena other than heating. Thus, chemically-activated, radiation-activated or pressure-sensitive bonding materials may be used.

Figure 7:
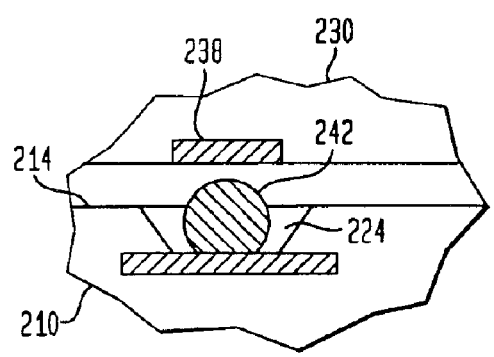
FIG. 7 is a fragmentary view, similar to FIG. 2, but depicting components according to a further embodiment of the invention.

In a further variant, the bumps 242 of a deformable metal (FIG. 7) may be pre-positioned within the recesses 224 in the top or first surface 214 of the interconnect element. Here again, the bump will deform within the recess and will take up tolerances in the assembly. However, during such deformation the bump forms a metallurgical bond with the contact 238 of the active microelectronic element 230.

The interconnect element itself may include active microelectronic devices. That is, the interconnect element itself may be an active semiconductor chip or wafer. Indeed, the bonding process discussed above for attachment between a chip and interconnect element can be used to connect separately formed chips or wafers to one another regardless of whether one chip or wafer serves as an in interconnect for the other. For example, the bonding process can be used to connect separately formed semiconductor wafers to one another so as to form a composite wafer which may then be handled or treated like any other wafer. Also, three or more structures can be joined using the process discussed above. For example, interconnect element (FIGS. 1 and 4) may have contacts on its second or bottom surface 14 similar to the top surface contacts 22. Wafers may be bonded to both sides of the interconnect elements so that the interconnect element serves to connect the wafers to one another.

Figure 8:
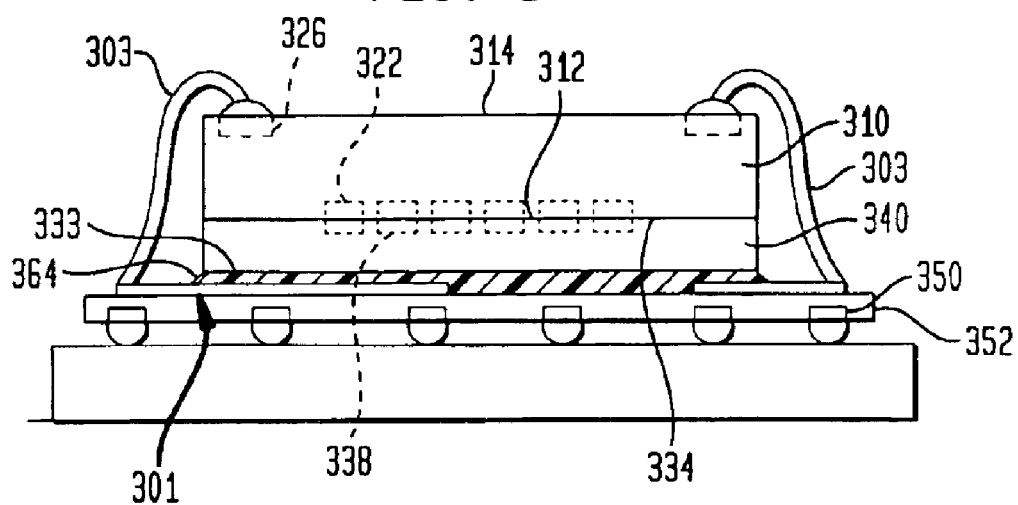
FIGS. 8, 9, 10 and 11 are diagrammatic elevational views of assemblies according to still further embodiments of the invention.

The placement of the terminals can be varied. For example, the assembly shown in FIG. 8 includes a chip 340 and interconnect element 310 having a front surface 334 facing the first surface 312 of the interconnect element, and having second contact pads 326 on a second surface 314 of the interconnect element. Here again, contacts at the front surface 334 of the chip are connected to first contact pads 322 of the interconnect element. These features may be similar to the chips and interconnect elements discussed above. However, the terminals 350 are disposed adjacent a rear surface 333 of chip 340, so that at least some of the terminals overlie the rear surface of the chip. The terminals overlying the chip are movable with respect to the chip and interconnect element. For example, a compliant layer 364 is disposed between the rear surface of the chip and the terminals overlying such surface. In the particular embodiment illustrated, terminals 350 are carried on a dielectric interposer 352, and compliant layer 364 is disposed between the chip rear surface and interposer 352. The interposer may have electrically conductive traces 301 on or between its surfaces. The second contacts 326 are connected to terminals 350 by wire bonds 303 extending downwardly from the second surface 314 to interposer 352, where they join traces 301. The wire bonds and traces thus form composite leads. The second contact pads 326 may be arranged in one or more rows adjacent the periphery of the interconnect element to facilitate wire bonding. The wire bonds typically are covered by an encapsulant (not shown). Other types of leads may be used instead of wire bonds.

Figure 9:
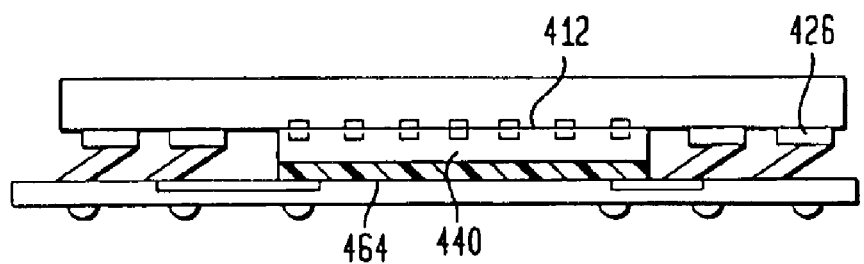

In the embodiment of FIG. 9, the second contact pads 426 are disposed on the first surface 412 of the interconnect element, i.e., on the same surface which faces the active microelectronic element or chip 440, and which carries the first contact pads 422 used to connect the interconnect conductors (not shown) to the chip. Some or all of terminals 450 may be disposed in alignment with chip 440, and a compliant layer 464 or other mechanical decoupling feature may be provided between the rear surface of the chip and the terminals. The leads used to connect second contact pads 426 to the terminals and traces on dielectric element 452 may be similar to the leads discussed above with reference to FIG. 4.

Figure 10:
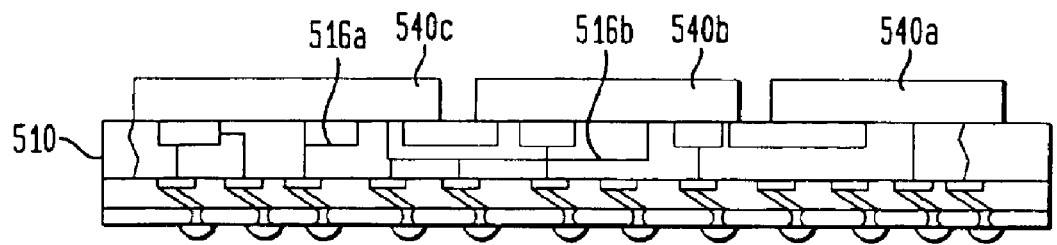

A multi-element module may be made by connecting plural chips or other microelectronic elements to the same interconnect element. For example, a first chip 540a and additional chips, 540b and 540c (FIG. 10) are all connected to a common interconnect element 510. The interconnect conductors 516 within interconnect element 510 include some conductors 516a which interconnect different portions of the same chip with one another, and also include conductors 516b which connect different chips of the module to one another. In other respects, the construction and operation of the module can be similar to the construction and operation of the single-chip assemblies discussed above.

Figure 11:
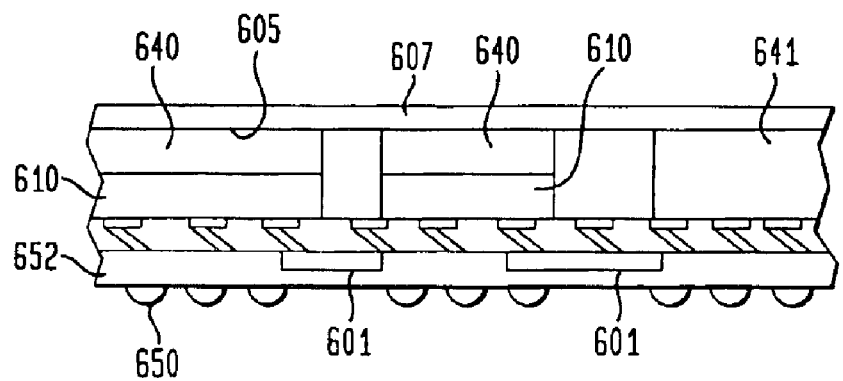

In the module of FIG. 11, multiple subassemblies 605, each including a microelectronic element 640 and interconnect element 610 similar to those discussed above, are all connected to terminals 650 on the same dielectric interposer 652. The module also includes a microelectronic element 641 directly connected to the interposer and terminals, without use of an interconnect element. For example, where element 641 has only a few input/output connections, there may be no need for an interconnect element associated with that element 641. The interposer may have traces 601 interconnecting the various microelectronic elements incorporated in the subassemblies and/or element 641. Here again, any of the configurations discussed above can be used. For example, some or all of the subassemblies may have the active microelectronic element adjacent the interposer, as discussed above with reference to FIG. 8. Compliant layers or other mechanical decoupling features can be employed. The module may have a common heat sink 607 or other exterior protective package.

As these and other variations and combination of the features discussed above can be utilized without departing from the present invention, the forgoing description of the preferred embodiments should be taken by way of illustration rather than by way of limitation of the invention as defined by the claims.

What is claimed is:

1. A method of fabricating a microelectronic assembly comprising the steps of:
   (a) providing an active microelectronic element including active devices in an active element body and active element contacts exposed at a surface of said active element body and electrically connected to said active devices;
   (b) separately providing an interconnect element including an interconnect element body, interconnect conductors having electrical conductivity at least equal to that of copper in said interconnect body, and contact pads electrically connected to said interconnect conductors;
   (c) joining said interconnect element to said active element so as to connect said interconnect conductors to said active devices, said joining step including forming substantially rigid metal-to-metal interconnects between said active element contacts and said contact pads using a substantially solid-phase bonding process; and
   (d) connecting terminals to at least some of said interconnect conductors so that said terminals are movable with respect to said interconnect body and so that said terminals are exposed for connection to an external substrate.

2. A method as claimed in claim 1 wherein said interconnect element body with said conductors has a coefficient of thermal expansion substantially equal to the coefficient of thermal expansion of said active element body.

3. A method as claimed in claim 1 wherein said step of connecting terminals is performed after said step of joining said interconnect element to said active element.

4. A method as claimed in claim 1 wherein said step of connecting terminals is performed before said step of joining said interconnect element to said active element.

5. A method as claimed in claim 1 wherein at least some of said interconnect conductors include a metal selected from the group consisting of copper and copper alloys.

6. A method as claimed in claim 1 wherein said active element includes a plurality of active devices in plural regions of said active element body, the method further comprising the step of severing said regions of said active element body from one another and severing portions of said interconnect body from one another after joining the interconnect body and active body so as to form individual assemblies, each including one or more semiconductor chips and a portion of the interconnect body joined to such one or more chips.

7. A method as claimed in claim 6 wherein said step of connecting terminals is performed before said severing step so that each of said individual assemblies resulting from said severing step includes a plurality of said terminals.

8. A method as claimed in claim 6 wherein, in each of said individual assemblies, at least some of the interconnect conductors connect active element contacts of the chip to one another to thereby provide routing of signals between portions of the chip.

9. A method as claimed in claim 1 wherein said substantially solid-phase bonding process includes bonding masses of bonding metal consisting predominantly of gold between said active element and bonding pads on said interconnect element.

10. A method as claimed in claim 1 wherein said bonding step includes forming said metal-to-metal interconnects by eutectic bonding or diffusion bonding.

11. A method as claimed in claim 1 wherein said joining step includes sealing said interconnect body to said active microelectronic element.

12. A method as claimed in claim 11 wherein said sealing step is performed simultaneously with said bonding step.

13. A method as claimed in claim 1 wherein said step of providing terminals includes connecting said terminals to said at least some of said interconnect conductors through leads and then deforming said leads by displacing said terminals away from said interconnect body so as to bend said leads.

14. A method as claimed in claim 13 wherein said step of connecting said terminals includes providing said termials on a dielectric interposer.

15. A method of joining microelectronic elements comprising the steps of:
   (a) juxtaposing
      (1) a first microelectronic element having a first body with a body surface and metallic contact bumps projecting from said body surface; and
      (2) a second microelectronic element having a second body with a first surface, recesses in said body surface and metallic contact pads disposed in said recesses; so that said body surfaces confront one another and so that said bumps project into said recesses;
   (b) bonding said bumps to said contact pads by a substantially solid-phase bonding process while urging said bodies toward one another so that at least some of said bumps, at least some of said contacts or both deform within said recesses.

16. A method as claimed in claim 15 further comprising bonding said body surfaces to one another.

17. A method as claimed in claim 16 wherein said step of bonding said body surfaces to one another is performed simultaneously with the step of bonding said bumps to said pads.

18. A method as claimed in claim 16 wherein said step of bonding said body surfaces to one another includes activating a bonding material carried on at least one of said body surfaces.

19. A method as claimed in claim 18 wherein said body surfaces are bonded to one another over substantially the entire body surfaces other than at said recesses and bumps.

20. A method as claimed in claim 18 wherein said bumps, pads and recesses are disposed in one or more active regions of said body surfaces and said body surfaces are bonded to one another only in bonding regions outside of said active regions.

21. A method as claimed in claim 20 wherein said bonding regions entirely surround each said active region.

22. A method as claimed in claim 16 wherein at least one of said microelectronic elements is an active semiconductor element having one or more active electronic devices therein.

23. A method as claimed in claim 16 wherein at least one of said microelectronic elements is a semiconductor chip.

24. A method as claimed in claim 16 wherein at least one of said microelectronic elements is a semiconductor wafer.

25. A method as claimed in claim 16 wherein said elements have substantially equal coefficients of thermal expansion.

* * * * *